United States Patent [19]
Nakao

[11] Patent Number: 5,187,636
[45] Date of Patent: Feb. 16, 1993

[54] DIELECTRIC DEVICE

[75] Inventor: Hironobu Nakao, Kyoto, Japan

[73] Assignee: Rohm Co., Ltd., Kyoto, Japan

[21] Appl. No.: 871,493

[22] Filed: Apr. 21, 1992

[30] Foreign Application Priority Data

Jul. 18, 1991 [JP] Japan .................................. 3-177911

[51] Int. Cl.[5] ........................ H01G 7/00; H01L 27/02
[52] U.S. Cl. .................................... 361/313; 257/310;
257/636; 257/639
[58] Field of Search ............................... 361/311–313;
29/25.42; 357/51, 54, 23.6; 437/30, 52

[56] References Cited

U.S. PATENT DOCUMENTS

| | | | |
|---|---|---|---|
| 4,882,649 | 11/1989 | Chen et al. | 361/313 |
| 4,990,463 | 2/1991 | Mori | 437/52 |
| 4,997,774 | 3/1991 | Kim | 437/30 |
| 5,017,982 | 5/1991 | Kobayashi | 357/51 X |
| 5,023,750 | 6/1991 | Hirayama | 361/313 |

Primary Examiner—Donald A. Griffin
Attorney, Agent, or Firm—Brumbaugh, Graves, Donohue & Raymond

[57] ABSTRACT

Si regions separated from a Si-rich $SiO_2$ film are nitrided to provide a film mainly consisting of $SiO_2$ regions an $Si_3N_4$ regions to be used for constituting a dielectric device or a capacitor.

4 Claims, 1 Drawing Sheet

DIELECTRIC DEVICE

BACKGROUND OF THE INVENTION

The present invention relates to a dielectric device having a high permittivity and good insulation characteristics.

Conventional capacitors are constituted, for instance, by first forming an N+-type drain region on part of a Si substrate, then forming a $SiO_2$ layer thereon, and finally forming a polysilicon electrode on the $SiO_2$ layer. However, such capacitors cannot provide a sufficiently large permittivity. With a recent increase of the degree of integration of this type of devices and a resultant reduction of the electrode area, it has been desired to utilize a material having a high permittivity.

SUMMARY OF THE INVENTION

In view of the present need as described above, an object to the present invention is to provide a dielectric device having a high permittivity and sufficient dielectric characteristics.

According to the invention, a dielectric device comprises:
 a Si substrate;
 an oxide film formed on the Si substrate; and
 a Si-rich $SiO_2$ nitride film formed on the oxide film and including $SiO_x$ regions and $SiN_x$ regions, the $SiN_x$ regions being formed by nitriding Si regions separated from a Si-rich $SiO_2$ film.

Using more specific terms, the dielectric device of the invention includes the $SiO_2$ film and the Si-rich $SiO_2$ nitride layer that mainly consists of $SiO_2$ regions and $Si_3N_4$ regions. The $SiO_2$ film is to provide sufficient insulation (i.e., dielectric breakdown) characteristics. On the other hand, in the Si-rich $SiO_2$ nitride film, while the $SiO_2$ regions also work to provide the sufficient insulation characteristics, the $Si_3N_4$ regions serve to increase the permittivity. Since the $Si_3N_4$ regions of the nitride film are a superior dielectric material though having insulation characteristics somewhat inferior to the $SiO_2$ film, the $SiO_2$ film used can be made thinner than the conventional dielectric device.

The capacitance of a capacitor is generally proportional to a relative permittivity of a dielectric material used therein. In the invention, the partial occupation by the $Si_3N_4$ regions, which have a relative permittivity larger than $SiO_2$, makes it possible to provide a larger capacitance compared with a same-sized dielectric device having only a $SiO_2$ film. When compared with a dielectric device having the same capacitance and having only a $SiO_2$ film, the area of the dielectric device can be made smaller by 10–20%. It is noted that relative permittivities of $SiO_2$ and $Si_3N_4$ are 3.9 and 7.0, respectively.

DESCRIPTION OF THE PREFERRED EMBODIMENT

Embodiments of the present invention are described hereinafter with reference to the accompanying drawings.

Figure 1:
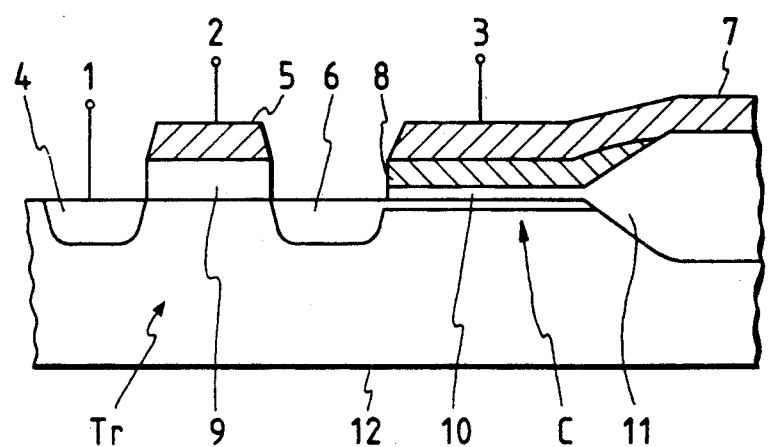
FIG. 1 is a sectional view of a DRAM cell according to an embodiment of the present invention.
Figure 2:
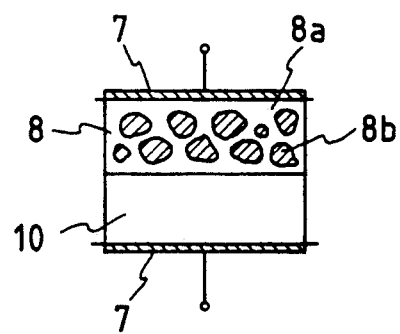
FIG. 2 is a sectional view of a capacitor according to another embodiment of the invention.

FIG. 1 is a sectional view of a DRAM cell according to an embodiment of the invention. FIG. 2 is a sectional view of a capacitor according to another embodiment.

To explain the FIG. 2 embodiment first, reference numeral 10 represents a $SiO_2$ layer; 8, Si-rich $SiO_2$ nitride layer; 8a, $SiO_2$ region; 8b, $Si_3N_4$ region; and 7, polysilicon electrode. The $Si_3N_4$ region 8b is formed by nitriding Si regions that have separated from the Si-rich $SiO_2$ layer.

Turning now to the embodiment of FIG. 1, a transistor portion Tr is formed by parts 1, 2, 4, 5, 6, 9 and 12 that are located on the left side in the figure, and a capacitor portion C is constituted of parts 12, 6, 10, 8, 7 and 3 that are on the right side. Reference numeral 1 represents a bit line; 2, word line; 3, cell plate; 4, source region; 5, gate electrode; 6, drain region; 7, polysilicon electrode; 8, Si-rich $SiO_2$ nitride film; 9, gate oxide film, 11, LOCOS layer; and 12, Si substrate.

Referring to FIG. 1, the capacitor portion C is constituted according to the following procedure: formation of a $SiO_2$ thin film 10 (its thickness is less than about 10 nm), formation of a Si-rich $SiO_2$ film, nitriding of it, and formation of an electrode (i.e., cell plate 3 made of polysilicon, aluminum, etc.). The Si-rich $SiO_2$ nitride film formed in this manner mainly consists of $SiO_x$ and $SiN_x$ regions. Where high insulation performance is not required, the above $SiO_2$ thin film 10 can be omitted. Conversely, where it is required, another $SiO_2$ thin film may be added below the cell plate 3.

A dielectric device having the above configuration is produced according to the following procedure: formation of the oxide film 10 on the Si substrate 12, formation of the Si-rich $SiO_2$ film on part of the oxide film 10, and nitriding separated Si regions in the Si-rich $SiO_2$ film to form the Si-rich $SiO_2$ nitride film 8.

A capacitor is produced according to the following procedure: formation of the oxide film 10 on the Si substrate 12, formation of the Si-rich $SiO_2$ film on part of the oxide film 10, nitriding separated Si regions in the Si-rich $SiO_2$ film to form the Si-rich $SiO_2$ nitride film 8, and formation of the polysilicon electrode film 7 on the nitride film 8.

A DRAM is produced as a combination of the dielectric device and the capacitor which are produced in the above manner.

As described in the above embodiments, according to the invention, the capacitor is produced, for instance, by forming the Si-rich $SiO_2$ film after formation of the oxide film on the Si substrate, then nitriding the separated Si regions to form the Si-rich $SiO_2$ nitride film, and finally forming the polysilicon electrode. Therefore, by virtue of partial existence of the $Si_3N_4$ regions, which have a relative permittivity larger than $SiO_2$, a larger capacitance can be obtained compared with a same-sized capacitor having only a $SiO_2$ film (the capacitance is proportional to the relative permittivity). When compared with a capacitor having only a $SiO_2$ film and the same capacitance, the area of the capacitor of the invention can be made smaller by 10–20%.

The dielectric device of the invention makes it possible to utilize the material having a larger relative permittivity, to utilize the very thin $SiO_2$ film having a thickness less than 10 nm, and to reduce the area of the memory cell (capacitor) by increasing the whole permittivity.

What is claimed is:
1. A dielectric device comprising:
 a Si substrate;

an oxide film formed on the Si substrate; and a Si-rich $SiO_2$ nitride film formed on the oxide film and including $SiO_x$ regions and $SiN_x$ regions, the $SiN_x$ regions being formed by nitriding Si regions separated from a Si-rich $SiO_2$ film.

2. A capacitor comprising:

a Si substrate;

an oxide film formed on the Si substrate;

a Si-rich $SiO_2$ nitride film formed on the oxide film and including $SiO_x$ regions and $SiN_x$ regions, the $SiN_x$ regions being formed by nitriding Si regions separated from a Si-rich $SiO_2$ film; and an electrode film formed on the Si-rich $SiO_2$ nitride film.

3. A capacitor comprising:

an oxide layer;

a Si-rich $SiO_2$ nitride layer formed on the oxide layer and including $SiO_x$ regions and $SiN_x$ regions, the $SiN_x$ regions being formed by nitriding Si regions separated from a Si-rich $SiO_2$ layer; and a pair of electrodes respectively formed on the oxide layer and the Si-rich $SiO_2$ nitride layer on the other side of their boundary surface.

4. A dynamic RAM comprising:

a Si substrate;

a dielectric device comprising:

a first part of the Si substrate;

a first oxide layer formed on the first part of the Si substrate; and a first Si-rich $SiO_2$ nitride film formed on the first oxide film and including $SiO_x$ regions and $SiN_x$ regions, the $SiN_x$ regions being formed by nitriding Si regions separated from a Si-rich $SiO_2$ film; and a capacitor comprising:

a second part of the Si substrate;

a second oxide layer formed on the second part of the Si substrate;

a second Si-rich $SiO_2$ nitride film formed on the first oxide film and including $SiO_x$ regions and $SiN_x$ regions, the $SiN_x$ regions being formed by nitriding Si regions separated from a Si-rich $SiO_2$ film; and an electrode film formed on the Si-rich $SiO_2$ nitride film.

* * * * *